# (12) United States Patent
Tajima et al.

US009512273B2

(10) Patent No.: US 9,512,273 B2
(45) Date of Patent: Dec. 6, 2016

(54) THERMOSETTING RESIN COMPOSITION

(71) Applicant: JNC CORPORATION, Tokyo (JP)

(72) Inventors: Akio Tajima, Kumamoto (JP); Takashi Matsuo, Kumamoto (JP); Kiichi Kawabata, Kumamoto (JP); Koichi Ayama, Tokyo (JP)

(73) Assignee: JNC CORPORATION, Tokyo (JP)

( * ) Notice: Subject to any disclaimer, the term of this patent is extended or adjusted under 35 U.S.C. 154(b) by 0 days.

(21) Appl. No.: 14/437,503

(22) PCT Filed: Oct. 11, 2013

(86) PCT No.: PCT/JP2013/077848
§ 371 (c)(1),
(2) Date: Apr. 22, 2015

(87) PCT Pub. No.: WO2014/065143
PCT Pub. Date: May 1, 2014

(65) Prior Publication Data
US 2015/0291737 A1    Oct. 15, 2015

(30) Foreign Application Priority Data

Oct. 22, 2012 (JP) ................................. 2012-232847

(51) Int. Cl.
| | |
|---|---|
| *C08G 77/14* | (2006.01) |
| *H01L 33/56* | (2010.01) |
| *C08K 3/36* | (2006.01) |
| *C08L 83/04* | (2006.01) |
| C08K 5/5435 | (2006.01) |
| C08G 77/04 | (2006.01) |
| C08G 77/12 | (2006.01) |
| C08G 77/20 | (2006.01) |

(52) U.S. Cl.
CPC ................. *C08G 77/14* (2013.01); *C08K 3/36* (2013.01); *C08L 83/04* (2013.01); *H01L 33/56* (2013.01); C08G 77/045 (2013.01); C08G 77/12 (2013.01); C08G 77/20 (2013.01); C08K 5/5435 (2013.01); H01L 2924/0002 (2013.01)

(58) Field of Classification Search
CPC ........... C08G 77/12; C08G 77/20; C08L 83/00
See application file for complete search history.

(56) References Cited

U.S. PATENT DOCUMENTS

| | | | |
|---|---|---|---|
| 5,571,853 A | 11/1996 | Ikeno et al. | |
| 2012/0112211 A1 | 5/2012 | Fujii et al. | |
| 2013/0131264 A1 | 5/2013 | Yoshitaka et al. | |
| 2015/0203677 A1* | 7/2015 | Nishiyama | ............... C08L 83/14 524/521 |

FOREIGN PATENT DOCUMENTS

| | | |
|---|---|---|
| JP | 06-234922 | 8/1994 |
| JP | 2007-031619 | 2/2007 |
| JP | 2007-224102 | 9/2007 |
| JP | 2010-095616 | 4/2010 |
| JP | 2011-190372 | 9/2011 |
| JP | 2012-012556 | 1/2012 |
| JP | 2012-102167 | 5/2012 |
| WO | 2008/133138 | 11/2008 |
| WO | 2011/145638 | 11/2011 |
| WO | 2011 148896 | * 12/2011 |

OTHER PUBLICATIONS

Bueche (Physical Properties of Polymers, Interscience Publishers, 1970) pp. 112-116.*
"International Search Report (Form PCT/ISA/210)", mailed on Jan. 14, 2014, with English translation thereof, pp. 1-4.
"Search Report of European Counterpart Application", issued on Mar. 29, 2016, p. 1-p. 8.

* cited by examiner

*Primary Examiner* — Kuo-Liang Peng
(74) *Attorney, Agent, or Firm* — Jianq Chyun IP Office

(57) ABSTRACT

The invention relates to a thermosetting resin composition containing (A) to (D) below.
(A) A thermosetting resin containing an SiH group and an alkenyl group, wherein the thermosetting resin is a reaction product between silsesquioxane having the SiH group and organopolysiloxane having two alkenyl groups; (B) a linear organopolysiloxane compound having an SiH group only at one terminal; (C) a silane coupling agent having an epoxy group; and (D) a Pt catalyst.

11 Claims, No Drawings

THERMOSETTING RESIN COMPOSITION

CROSS-REFERENCE TO RELATED APPLICATION

This application is a 371 application of an international PCT application serial no. PCT/JP2013/077848, filed on Oct. 11, 2013, which claims the priority benefit of Japan Patent Application no. 2012-232847, filed on Oct. 22, 2012. The entirety of each of the above-mentioned patent applications is hereby incorporated by reference herein and made a part of this specification.

TECHNICAL FIELD

The present invention is contemplated for providing a thermosetting resin composition having both heat resistance and a high refractive index and containing a thermosetting resin formed of silsesquioxane and organopolysiloxane, and a hardened material obtained by hardening the thermosetting resin composition, a composition for an optical semiconductor, the composition containing the thermosetting resin composition, and an optical semiconductor device including the composition for the optical semiconductor.

BACKGROUND ART

A white LED has been used in an application such as illumination. However, heat generation from an LED package becomes a problem in connection with achieving high power. In the case where an epoxy resin is used for a sealing material, avoidance of yellowing due to the heat generation becomes quite difficult, and therefore a silicone resin has been used for the sealing material of the white LED in place of the epoxy resin. The silicone resin used for the LED is generally classified into two kinds including a phenyl silicone resin and a methyl silicone resin.

The phenyl silicone resin generally used therefor has a high refractive index and a good light-extraction efficiency. Moreover, the resin has a high gas barrier property and also a good adhesion with a package, and therefore has excellent reliability such as moisture-absorption reflow resistance and heat cycle resistance. However, while the resin is superior to the epoxy resin in resistance to thermal yellowing, the resin is far from sufficient in order to respond to achievement of high power of the LED.

The methyl silicone resin is superb in the resistance to thermal yellowing, but has a low refractive index, and therefore has a poor light-extraction efficiency from the LED. Moreover, the methyl silicone resin is mainly composed of dimethyl silicone, and therefore has a low gas barrier property, and also a poor adhesion with the package, and thus has had a problem of being easily peeled during moisture-absorption reflow. In a case where peeling is caused, brightness of light generated from the LED decreases, and therefore such a case is not preferred.

Further, a high power LED appears, and particularly when a package size is small, heat is locally accumulated in a resin portion, and a problem of causing cracks has come up. In a current-carrying test at a high temperature using the high power LED, a temperature in the resin portion is reputedly arrived at a high temperature region of 200° C. or higher, and therefore long-term reliability in the higher temperature region has been required.

In the high-temperature region, in the phenyl silicone resin generally used therefor, brightness degradation by yellowing is significant, and also the cracks are caused by resin deterioration. In the dimethyl silicone resin, although the brightness degradation by yellowing is low, the deterioration of the resin progresses in the high-temperature region, the cracks are caused, and the brightness is degraded, and therefore the resin is inapplicable to an application of the high power LED in several cases.

As described above, characteristics required for an LED sealing material becomes increasingly tough. Therefore, eager wish has been expressed for the sealing material that can respond to the high power of the white LED and achieve both the high refractive index and heat resistance, and further for the thermosetting resin composition having a balance regarding all of the moisture-absorption reflow resistance, the heat cycle resistance and so forth.

A cage silsesquioxane material having excellent heat resistance and UV resistance attracts attention, and the LED sealing material using such a material has been reported.

Patent literature No. 1 discloses an LED sealing material formed of a thermosetting resin composition by a thermosetting resin having cage silsesquioxane into which an SiH group is introduced, and organopolysiloxane having an alkenyl group.

Patent literature No. 2 discloses a thermosetting resin composition using imperfect cage silsesquioxane as commonly referred to as a double decker type. The silsesquioxane is a compound obtained from hydrolytic condensation of phenyltrimethoxysilane, and a position of an Si—Ph group thereof is not random and is subjected to structure control, and therefore the silsesquioxane has excellent heat resistance and light resistance even with the high refractive index.

Patent literature No. 2 discloses a thermosetting resin containing an SiH group and a vinyl group as obtained from a reaction between a compound having a modified SiH group in a base of a silanol group of imperfect cage structure silsesquioxane, and organopolysiloxane having an vinyl group. Then, a hardened material obtained by hardening the thermosetting resin is described to have the high heat resistance even with the high refractive index, and further a good adhesion with a polyphthalamide resin base material or a silver base material, being an LED package material.

CITATION LIST

Patent Literature

Patent literature No. 1: JP 2012-102167 A.
Patent literature No. 2: WO 2011/145638 A.

SUMMARY OF INVENTION

Technical Problem

Patent literature No. 1 describes only heat resistance (at 200° C.) of a thermosetting resin composition to give no description on characteristics required for an LED sealing material, such as adhesion with a base material, heat cycle resistance and moisture-absorption reflow resistance. Moreover, the composition is basically composed of a unit of —Me$_2$Si—O, and therefore a refractive index thereof is not high. Properties of the composition are a solid at a normal temperature, and is applicable to sealing of the LED according to a molding system, but inapplicable to sealing according to a dispenser system.

A hardened material using a thermosetting resin containing an SiH group and a vinyl group as obtained from a reaction between double decker silsesquioxane having four SiH groups and organopolysiloxane having two vinyl groups as described in Patent literature No. 2 has a problem of deterioration of adhesion performance when a content of the double decker silsesquioxane is low.

On the other hand, when the content of silsesquioxane is high, although the adhesion performance becomes high, the resin becomes excessively hard in several cases. As a result, no stress relaxation is allowed, resulting in having a problem of causing peeling from an LED package in a thermal shock test such as a heat cycle test. Further, in a wire-bonding type package system, the resin has a problem of easily causing wire cutting.

The invention is contemplated for providing a thermosetting resin composition having both heat resistance and UV resistance, and having a high refractive index and a high gas barrier property, and a high adhesion even with a low hardness, and an excellent moisture-absorption reflow resistance and heat cycle resistance, and an excellent reliability as the LED sealing material.

Solution to Problem

The present inventors have diligently continued to conduct study so as to solve the problem. As a result, the present inventors have found that the problem can be solved by incorporating into a thermosetting resin composition a thermosetting resin containing an SiH group and an alkenyl group as obtained from a reaction between silsesquioxane having the SiH group and organopolysiloxane having two alkenyl groups, a linear organopolysiloxane compound having an SiH group only at one terminal, a coupling agent having an epoxy group as an additive, and a Pt catalyst to achieve a low hardness of a hardened material without sacrificing a high refractive index, heat resistance, and also adhesion performance, and thus have completed the invention.

More specifically, the invention is as described below.

Item 1. A thermosetting resin composition containing (A) to (D) below:

(A) a thermosetting resin containing an SiH group and an alkenyl group, wherein the thermosetting resin is a reaction product between silsesquioxane having the SiH group and organopolysiloxane having two alkenyl groups;

(B) a linear organopolysiloxane compound having an SiH group only at one terminal;

(C) a silane coupling agent having an epoxy group; and (D) a Pt catalyst.

Item 2. The thermosetting resin composition according to item 1, wherein the silsesquioxane is double decker silsesquioxane.

Item 3. The thermosetting resin composition according to item 1 or 2, containing organopolysiloxane compound (E) having two or more alkenyl groups when necessary.

Item 4. The thermosetting resin composition according to any one of items 1 to 3, wherein the thermosetting resin (A) is a compound represented by formula (1) below.

Formula 1

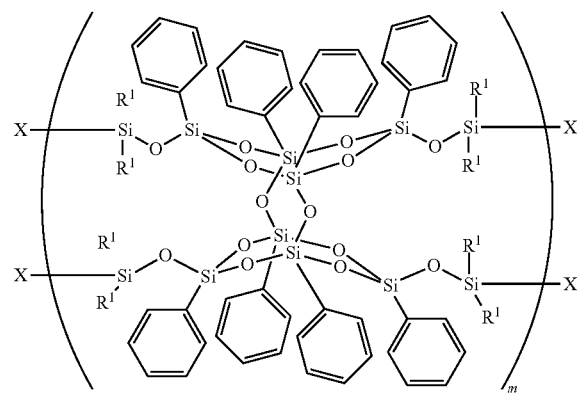

In formula (1), X is each independently a group represented by formula (X-I), formula (X-II) or formula (X-III), and when the number of groups represented by formula (X-I) per molecule of the compound represented by formula (1) (average in one molecule of the compound when the compound is a mixture of compounds in which a ratio of a group represented by formula (X-I), a ratio of a group represented by formula (II) and a ratio of a group represented by formula (X-III) are different) is taken as a, the number of groups represented by formula (X-II) is taken as b, and the number of groups represented by formula (X-III) is taken as c, expressions: a+2b+c=4, 0<a≤3, 0≤b≤1, and 0<c≤3 hold.

$R^1$ is each independently a group selected from alkyl having 1 to 4 carbons, cyclopentyl and cyclohexyl, and m is 1 to 100.

Formula 2

(X-I)

Formula 3

(X-II)

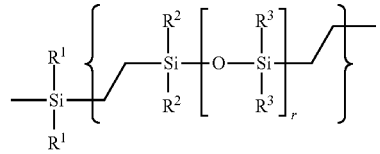

In formula (X-II), $R^2$ and $R^3$ are each independently a group selected from alkyl having 1 to 4 carbons, cyclopentyl, cyclohexyl and phenyl, $R^1$ is the same as $R^1$ in formula (1), r is the number of repetitions of —OSi($R^3$)$_2$—, and r is a mean value satisfying 2 to 20.

Formula 4

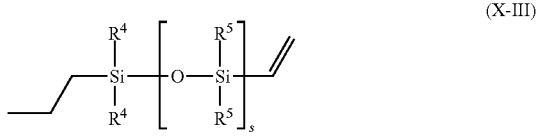

In formula (X-III), $R^4$ and $R^5$ are each independently a group selected from alkyl having 1 to 4 carbons, cyclopentyl, cyclohexyl and phenyl, s is the number of repetitions of —OSi($R^5$)$_2$—, and s is a mean value satisfying 2 to 20.

Item 5. The thermosetting resin composition according to any one of items 1 to 4, wherein the linear organopolysiloxane compound (B) having the SiH group only at one terminal is a compound represented by formula (2) blow.

Formula 5

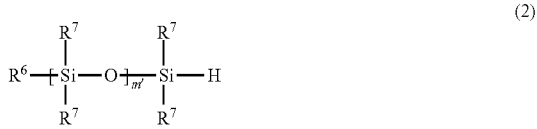

In formula (2), $R^6$ and $R^7$ are each independently a group selected from alkyl having 1 to 4 carbons, cyclopentyl and cyclohexyl, m' is the number of repetitions of —OSi($R^7$)$_2$—, and is a mean value satisfying 1 to 20.

Item 6. The thermosetting resin composition according to any one of items 3 to 5, wherein the organopolysiloxane compound (E) having two or more alkenyl groups is a compound represented by formula (3) blow.

Formula 6

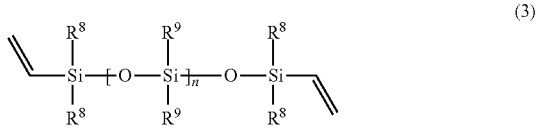

In formula (3), $R^8$ and $R^9$ are each independently a group selected from alkyl having 1 to 4 carbons, cyclopentyl, cyclohexyl and phenyl, and n is the number of repetitions of —OSi($R^9$)$_2$—, and is a mean value satisfying 1 to 50.

Item 7. The thermosetting resin composition according to any one of items 1 to 6, wherein a ratio of blending the thermosetting resin (A) is 70 to 95% by mass, a ratio of blending the organopolysiloxane compound (B) is 2 to 20% by mass, and a ratio of blending the silane coupling agent (C) is 0.1 to 5.0% by mass, based on the total amount of the thermosetting resin composition.

Item 8. The thermosetting resin composition according to any one of items 3 to 7, containing the organopolysiloxane compound (E) in a ratio of 1 to 10% by mass when necessary.

Item 9. The thermosetting resin composition according to any one of items 1 to 8, further containing at least one of silica and a phosphor.

Item 10. A hardened material, obtained by hardening the thermosetting resin composition according to any one of items 1 to 9.

Item 11. A composition for an optical semiconductor, containing the thermosetting resin composition according to any one of items 1 to 9.

Item 12. An optical semiconductor device, including as a sealing material the composition for the optical semiconductor according to item 11.

Advantageous Effects of Invention

A hardened material obtained by hardening a thermosetting resin composition according to the invention can reduce hardness of the hardened material, while the material keeps advantages of a high refractive index and a high heat resistance, and an excellent adhesion performance. Therefore, the hardened material sealed with the thermosetting resin composition according to the invention has an excellent stress relaxation ability, and an optical semiconductor apparatus prepared using the thermosetting resin composition can be formed into the optical semiconductor apparatus that can withstand a severe reliability test such as a heat cycle resistance test. Furthermore, the apparatus is formed into the optical semiconductor apparatus that has a low surface tackiness even with a low hardness, can be diced, and is excellent also in shaping properties.

The thermosetting resin composition according to the invention has a silsesquioxane skeleton as a main component, and therefore the hardened material has an excellent heat resistance and also UV resistance. Furthermore, the hardened material exhibits an excellent adhesion with a housing base material such as a polyphthalamide resin, silver or ceramics, and can withstand a severe reliability test such as a moisture-absorption reflow test and a heat cycle test.

Excellent characteristics of the thermosetting resin composition according to the invention are thought to be caused by capability of suppressing crosslinked density when an organopolysiloxane compound having an SiH group only at one terminal according to the invention reacts with an alkenyl group of the thermosetting resin of imperfect cage silsesquioxane having an SiH group and an alkenyl group as a main agent, resulting in a material having a low hardness allowing stress relaxation, and also allowing no change in physical properties a hardened resin itself in which, in the organopolysiloxane compound having the SiH group only at one terminal, only one terminal of the compound is bonded, and therefore a degree of freedom is high.

DESCRIPTION OF EMBODIMENTS

The invention is described in detail below.

A thermosetting resin composition according to the invention has features of containing (A) to (D) bellow.

(A) a thermosetting resin containing an SiH group and an alkenyl group, the thermosetting resin being a reaction product between silsesquioxane having the SiH group and organopolysiloxane having two alkenyl groups;

(B) a linear organopolysiloxane compound having an SiH group only at one terminal;

(C) a silane coupling agent having an epoxy group; and (D) a Pt catalyst.

Each component is described below.

(A) Thermosetting Resin Containing an SiH Group and an Alkenyl Group, the Thermosetting Resin Being a Reaction Product Between Silsesquioxane Having the SiH Group and Organopolysiloxane Having Two Alkenyl Groups Thermosetting resin (A) is a reaction product between silsesquioxane having the SiH group and organopolysiloxane having two alkenyl groups.

Specific examples of the silsesquioxane having the SiH group include double decker silsesquioxane and cage silsesquioxane having T8 structure. While the cage silsesquioxane having T8 structure has eight functional groups, the double decker silsesquioxane used in the invention has only four functional groups and is easy in controlling the structure.

As is different from complete condensation type cage silsesquioxane, the double decker silsesquioxane preferably used in the invention is an imperfect condensation type in which a degree of freedom of molecules thereof is comparatively high and is excellent in flexibility. From such a viewpoint, the double decker silsesquioxane is preferred.

Specific examples of thermosetting resin (A) include a compound represented by formula (1) below.

Formula 7

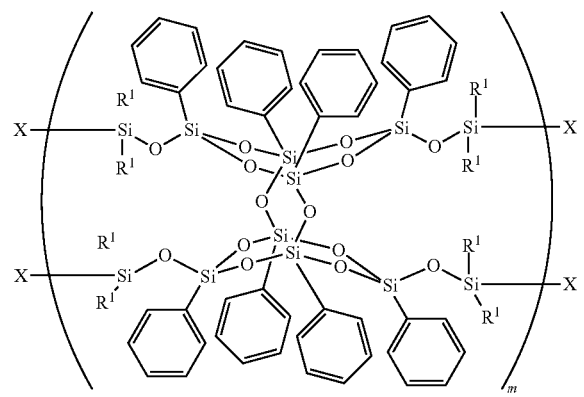

(1)

In formula (1), X below is each independently a group represented by formula (X-I), formula (X-II) or formula (X-III) below. $R^1$ is each independently a group selected from alkyl having 1 to 4 carbons, cyclopentyl and cyclohexyl, and m is 1 to 100. Above all, m is preferably 1.

Formula 8

—H  (X-I)

Formula 9

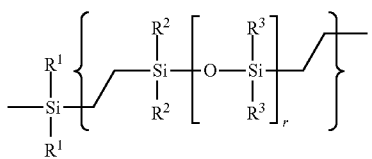

(X-II)

In formula (X-II), $R^2$ and $R^3$ are each independently a group selected from alkyl having 1 to 4 carbons, cyclopentyl, cyclohexyl and phenyl, and preferably methyl. Then, r is the number of repetitions of —OSi($R^3$)$_2$—, and is a mean value satisfying 2 to 20, Then, r is further preferably 2 to 10. Then, $R^1$ is the same as $R^1$ in formula (1).

Formula 10

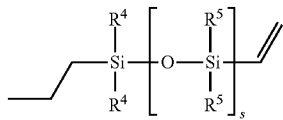

(X-III)

In formula (X-III), $R^4$ and $R^5$ are each independently a group selected from alkyl having 1 to 4 carbons, cyclopentyl, cyclohexyl and phenyl, s is the number of repetitions of —OSi($R^5$)$_2$—, and s is a mean value satisfying 2 to 20. Then, s is preferably 2 to 10, and further preferably 2 to 4.

When the number of groups represented by formula (X-I) per molecule of the compound represented by formula (1) (average in one molecule of the compound when the compound is a mixture of compounds in which a ratio of a group represented by formula (X-I), a ratio of a group represented by formula (II) and a ratio of a group represented by formula (X-III) are different) is taken as a, the number of groups represented by formula (X-II) is taken as b, and the number of groups represented by formula (X-III) is taken as c, expressions: a+2b+c=4, 0<a≤3, 0≤b≤1, and 0<c≤3 hold.

In the invention, the compound in the range of satisfying the expressions: a+2b+c=4, 0<a≤3, 0≤b≤1, and 0<c≤3 is described.

The compound represented by formula (1) satisfies an expression: a>c in which the number of SiH groups is larger than the number of vinyl groups on average, and can be defined as a so-called SiH group type thermosetting resin. As for the a, from a viewpoint of significantly developing excellent characteristics upon forming a hardened material, a is preferably 1.0 to 3.0, and further preferably, 1.3 to 2.5.

Then, a, b, and c in the compound represented by formula (1) can be arbitrarily adjusted by the inventor, for example, according to the manufacturing method described in WO 2011/145638 A.

The thermosetting resin composition according to the invention preferably contains the thermosetting resin (A) in an amount of 70 to 95% by mass, and further preferably, 80 to 90% by mass, based on the total amount of the thermosetting resin composition. When the ratio of blending thermosetting resin (A) is adjusted to 70 or more % by mass, characteristics of the double decker silsesquioxane, more specifically, heat resistance, UV resistance, a high refractive index and so forth can be retained. When the ratio of blending thermosetting resin (A) is adjusted to 95% by mass or less, hardness of the hardened material can be adjusted to D45 or less.

(B) Linear Organopolysiloxane Compound Having the SiH Group Only at One Terminal Specific examples of the linear organopolysiloxane compound having the SiH group only at one terminal include a compound represented by formula (2) below.

Formula 11

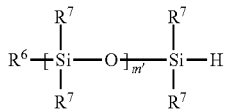

(2)

In the formula (2), $R^6$ and $R^7$ are each independently a group selected from alkyl having 1 to 4 carbons, cyclopentyl and cyclohexyl, and preferably a methyl group having 1 carbon or a butyl group having 4 carbons. Then, m' is the number of repetitions of —OSi($R^7$)$_2$—. Then, m is a mean value satisfying 4 to 20, and preferably, 4 to 15, and further preferably, 5 to 10.

Organopolysiloxane compound (B) can be prepared by a known conventional method, for example, according to the method described in JP 2000-273178 A or JP 2001-055446 A.

Organopolysiloxane compound (B) is used in order to reduce the hardness. More specifically, a rise of the hardness can be suppressed by allowing compound (B) to react with the alkenyl group of the thermosetting resin (A) to reduce whole crosslinking density, and the low hardness can be achieved.

A content of organopolysiloxane compound (B) in the thermosetting resin composition according to the invention is preferably a level at which a refractive index of the hardened material obtained by hardening the thermosetting composition becomes 1.5 or more. Moreover, if the content is too low, no reduction of the hardness is caused, and therefore the content is preferably a level at which the hardness of the hardened material becomes D40 or less.

The number average molecular weight of organopolysiloxane compound (B) is preferably 148 to 2,000, and further preferably, 400 to 1,000. If the number average molecular weight of organopolysiloxane compound (B) is 400 or less, volatility becomes high and organopolysiloxane compound (B) is likely vaporized in a stage in which a hardening composition is blended and hardened, and therefore the number average molecular weight is further preferably 400 or more. Moreover, when the number average molecular weight of organopolysiloxane compound (B) is adjusted to 2,000 or less, compatibility with a reaction product between silsesquioxane having the SiH group and organopolysiloxane having two alkenyl groups, and the thermosetting resin containing the SiH group and the alkenyl group can be kept, and transparency of the hardened material and adhesion performance thereof can be kept.

A ratio of blending organopolysiloxane compound (B) is preferably adjusted to 5 to 20% by mass, and further preferably adjusted to 5 to 15% by mass in the total thermosetting resin composition according to the invention. When the ratio of blending organopolysiloxane compound (B) is adjusted to 5 or more % by mass, the hardness of the hardened material can be reduced to D45 or less. Moreover, when the ratio of blending organopolysiloxane compound (B) is adjusted to 20% by mass or less, the hardened material having a low hardness can be effectively obtained, while characteristics such as the heat resistance, the UV resistance, the adhesion performance of the hardened material are retained.

(C) Silane Coupling Agent Having an Epoxy Group

Specific examples of silane coupling agent (C) having the epoxy group include 2-(3,4-epoxycyclohexyl)ethyltrimethoxysilane, 3-glycidoxypropyltrimetoxysilane, 3-glycidoxypropylmethyldimetoxysilane, 3-glycidoxypropyltriethoxysilane and 3-glycidoxypropylmethyldiethoxysilane. Among the agents, 3-glycidoxypropyltrimetoxysilane is further preferred.

A ratio of blending silane coupling agent (C) is preferably adjusted to 0.1 to 5.0% by mass, and further preferably adjusted to 0.2 to 2% by mass in the total thermosetting resin composition according to the invention. The ratio is furthermore preferably 0.25 to 1.0% by mass. When the ratio of blending silane coupling agent (C) is adjusted to 0.1% by mass or more, wettability of the hardening resin to an LED package base material can be increased, heat cycle resistance can be maintained. Moreover, when the ratio of blending silane coupling agent (C) is adjusted to 5.0% by mass or less, the heat resistance can be retained.

(D) Pt Catalyst

The Pt catalyst contains platinum, and the platinum may be unoxidized or oxidized. Specific examples of oxidized platinum include platinum oxide. Specific examples of partially oxidized platinum include an Adam's catalyst.

Specific examples of the Pt catalyst include a Karstedt catalyst, a Speier catalyst and hexachloroplatinic acid. The catalysts are generally well known. Among the catalysts, a Karstedt catalyst of unoxidized type is preferred.

A ratio of blending Pt catalyst (D) in the total thermosetting resin composition according to the invention is preferably sufficiently in an amount to promote hardening the thermosetting resin composition according to the invention, and specifically preferably adjusted to 0.01 to 10 ppm, and further preferably adjusted to 0.1 to 1 ppm. When the ratio of blending Pt catalyst (D) is adjusted to 0.01 ppm or more, hardening can be promoted. When the ratio of blending Pt catalyst (D) is adjusted to 0.1 ppm or more, hardening can be quickly promoted. Moreover, when the ratio of blending Pt catalyst (D) is adjusted to 10 ppm or less, the heat resistance of the hardened material can be retained.

(E) Organopolysiloxane Compound Having Two or More Alkenyl Groups

The thermosetting resin composition according to the invention may contain organopolysiloxane compound (E) having two or more alkenyl groups when necessary. Specific examples of organopolysiloxane compound (E) having two or more alkenyl groups include a compound represented by a formula below.

Formula 12

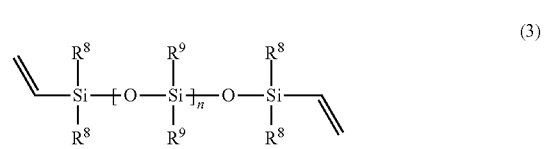

(3)

In formula (3), $R^8$ and $R^9$ are each independently a group selected from alkyl having 1 to 4 carbons, cyclopentyl, cyclohexyl and phenyl, and n is the number of repetitions of —OSi($R^9$)$_2$—, and is a mean value satisfying 1 to 50.

Organopolysiloxane compound (E) is a component for adjusting viscosity of the thermosetting composition according to the invention, or for supplementarily providing strength or flexibility for the hardened material. In the formula (3), when all of $R^8$ and $R^9$ are alkyl having 1 to 4 carbons, a methyl group having 1 carbon is preferably used, and represented by formula (4) below.

Formula 13

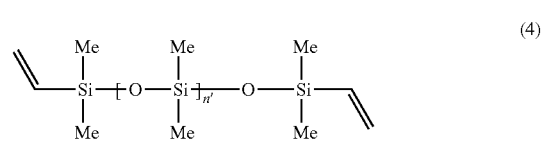

(4)

In the formula (4), n' is a mean value satisfying 1 to 20. If n' exceeds 20, compatibility with the thermosetting composition according to the invention is deteriorated, and thus such a case is not preferred. In view of providing the flexibility, n' is preferably 5 or more, and from a viewpoint of gas barrier, n' is preferably 10 or less. Moreover, 5 to 8 are particularly preferred from viewpoints of the flexibility and the gas barrier.

Moreover, the compound represented by formula (5) or (6) below, in which at least part of $R^8$ and $R^9$ in the formula (3) is a phenyl group, can also be preferably used.

Formula 14

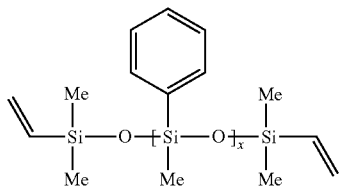

(5)

In the formula (5), x is a mean value satisfying 1 to 50, and is preferably 1 to 20.

Formula 15

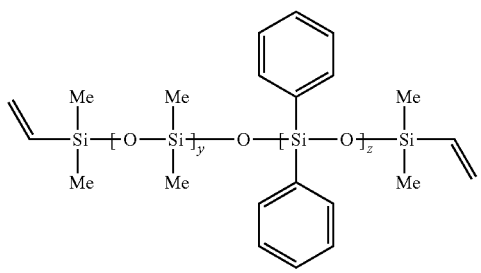

(6)

In the formula (6), (y+z) is a mean value satisfying 1 to 50, and from a viewpoint of the refractive index and the gas barrier, is preferably a value satisfying an expression: y/(y+z)<0.5. In view of providing the hardened material with the flexibility, (y+z) is preferably 10 or more.

Organopolysiloxane compound (E) having two or more alkenyl groups described above may be used in combination arbitrarily by the invention.

Organopolysiloxane compound (E) can be prepared by a known conventional method. For example, the organopolysiloxane compound represented by formula (4) can be prepared by allowing an equilibration reaction of tetramethylvinyldisiloxane with octamethylcyclotetrasiloxane in the presence of a solid acid catalyst as such activated clay, and then removing the solid acid catalyst by filtration, and then cutting a low-boiling portion under conditions of vacuum of about 0.13 kPa and under conditions of a temperature in the range from 100 to 120° C.

For example, the organopolysiloxane compound represented by formula (5) or formula (6) can be prepared by a known conventional method. Moreover, the organopolysiloxane compound represented by formula (5) or formula (6) is industrially available from GELEST, Inc.

A ratio of blending organopolysiloxane compound (E) is preferably adjusted to 10% by mass or less in the total thermosetting resin composition according to the invention. When the ratio of blending organopolysiloxane compound (E) is adjusted to 10% by mass or less, the heat resistance is improved and resin strength increases, and therefore such a ratio is preferred.

In the thermosetting resin composition according to the invention, a component described below may be further blended.

(i) Hardening Retarder

As a hardening retarder, a known retarder used in an addition type hardening composition using a hydrosilylation catalyst can be used. Specific examples include a compound containing two or more alkenyl groups, a compound containing an aliphatic unsaturated bond, an organic phosphorous compound, a tin-based compound and an organic peroxide. The retarders may be used alone or in combination of two or more kinds.

Specific examples of the compound containing two or more alkenyl groups include disiloxane having vinyl groups at both terminals, trisiloxanes and vinyl group-containing cyclic cyclosiloxanes such as 1,3,5,7-tetravinyltetramethyl-cyclotetrasiloxane.

Specific examples of the compound containing the aliphatic unsaturated bond include propargyl alcohols such as 3-methyl-1-dodecyne-3-ol, 3,5-dimethyl-1-hexyn-3-ol, 1-ethynyl-1-cyclohexanol, ene-yn compounds, maleic anhydride and maleates such as dimethyl maleate.

Specific examples of the organic phosphorous compound include triorganophosphines, diorganophosphines, organophosphones and triorganophosphites.

Specific examples of the tin-based compound include stannous halide dihydrate and stannous carboxylate. Moreover, specific examples of the organic peroxide include di-t-butyl peroxide, dicumyl peroxide, benzoyl peroxide and t-butyl perbenzoate.

Among the retarders, 1,3-divinyl disiloxane, 1,3,5,7-tetravinyl tetramethyl cyclotetrasiloxane or 1-ethynyl-1-cyclohexanol is preferred.

When the hardening retarder is blended with the thermosetting resin composition according to the invention, a rise of viscosity at room temperature can be suppressed, and also a pot life thereof can be prolonged. A content of the hardening retarder in the thermosetting resin composition according to the invention is preferably 0.001 to 0.1% by mass, and further preferably, 0.01 to 0.05% by mass.

(ii) Phosphor

A phosphor is dispersed into the thermosetting resin composition according to the invention, thereby having a light-emitting function, and allowing use as an LED composition. A content of the phosphor in the thermosetting resin composition according to the invention is preferably 1 to 90% by mass, and further preferably, 2 to 50% by mass.

The phosphor that can be used in the thermosetting resin composition according to the invention is not restricted. Moreover, a concentration distribution of the phosphor in the composition may be uniform or different. A kind of the phosphor to be used, presence or absence of the concentration distribution of the phosphor, and conditions of the distribution may be determined according to an use environment, an application or a purpose of the LED.

(iii) Silica

In the thermosetting resin composition according to the invention, silica may be added for a purpose of improvement in the resin strength or preventing sedimentation of the phosphor. A ratio of silica in the thermosetting resin composition according to the invention is preferably 1 to 10% in terms of a weight ratio based on the total amount of the thermosetting resin composition.

As silica, a product obtained by grinding naturally occurring silica stone (natural silica) into fine power may be used, or industrially synthesized silica (synthetic silica) may also be used. In the case of the natural silica, the silica is crystalline, and therefore has a crystal axis. Accordingly, while optical features derived from a crystal may be expected, specific gravity thereof is slightly higher in comparison with the synthetic silica, and therefore dispersion into the thermosetting resin composition may be influenced. When a natural product is pulverized to obtain the silica, the resultant material may be formed into particles having indefinite shape or a material having a broad particle size distribution.

The synthetic silica includes wet synthetic silica and dry synthetic silica, but use thereof is not particularly limited in the invention. However, the synthetic silica may have water of crystallization without regard to preparation processes in several cases. When the water of crystallization may have a somewhat influence on the thermosetting resin composition, the hardened material, the LED element, or the like, the synthetic silica is preferably selected in consideration of the number of water of crystallization.

The synthetic silica is amorphous, and not crystalline, and therefore has no crystal axis, and particular optical features derived from the crystal are unexpectable. However, the synthetic silica can take advantage of features of capability of significantly reducing a particle size in addition to control of a particle distribution.

In particular, fumed silica has a particle size in a nano order, and is excellent in dispersibility of the particles. Further, when comparison is made in identical weight, as the particle size is smaller, a sum of surface areas becomes larger, and thus a direction of light reflection is further diversified, and therefore such fumed silica can be further preferably used.

Moreover, the silica generally has a large surface area and is a hydrophilic material (hydrophilic silica) due to an effect of silanol existing on the surface, but can be processed into hydrophobic silica by chemical modification. Use of silica having either properties is selected according to a purpose, but in the invention, use of hydrophilic silica is preferred in experimental verification.

A method for manufacturing the thermosetting resin composition according to the invention is not particularly limited, and specific examples include a method in which a mixer such as a homodisper, a homo mixer, a universal mixer, a planetary mixer, a kneader, a three-roll, and a bead mill is used, and under ordinary temperature or warming, a hardening retarder or the silicone resin as described above, and when necessary, a thermosetting agent, an antioxidant or the like as described above in a predetermined amount for each are mixed.

An application of the thermosetting resin composition or the hardened material thereof according to the invention is not particularly limited, but can be used, for example, as a sealing agent, a housing material, a die bonding material for connecting with a lead electrode or a heat sink, an underfill material when a light-emitting device of an optical semiconductor device, such as a light-emitting diode, is subjected to flip chip mounting, or a passivation film on the light-emitting device. Above all, the optical semiconductor apparatus that can efficiently extract light by light emission from the optical semiconductor device can be manufactured, and thus the composition can be preferably used as the sealing agent, the underfill material or the die bonding material.

As conditions under which the thermosetting resin composition according to the invention is hardened by heating to obtain the hardened material, temperature is preferably in the range of 60 to 200° C., and further preferably, in the range of 80 to 160° C. Moreover, a period of time is preferably in the range of 1 to 24 hours, and further preferably, in the range of 2 to 5 hours.

The hardness of the hardened material obtained by hardening the thermosetting resin composition according to the invention is preferably in the range of 45 or less in terms of D hardness, or 30 or more in terms of A hardness. As the refractive index thereof, a high refractive index of 1.5 or more is preferred. When the refractive index is 1.5 or more, the hardened material excellent in the optical extraction efficiency from the LED is formed.

A method for sealing the light-emitting device using the composition for the optical semiconductor according to the invention is not particularly limited, and specific examples include a method for preliminarily injecting the composition for the optical semiconductor according to the invention into a mold form, and dipping a lead frame or the like to which the light-emitting device is fixed thereinto, and then hardening the composition, and a method for injecting the composition for the optical semiconductor according to the invention into a form in which a light-emitting device is inserted and then hardening the composition.

Specific examples of the method for injecting the composition for the optical semiconductor thereinto according to the invention include injection by a dispenser, transfer molding and injection molding. Further, specific examples of other sealing methods include a method of adding dropwise the composition for the optical semiconductor according to the invention onto a light-emitting device, applying the composition thereon by stencilling, screen printing and application through a mask to harden the composition, and a method of injecting by a dispenser the composition for the optical semiconductor according to the invention into a cup in which a light-emitting device is arranged at a bottom thereof, and hardening the composition.

The optical semiconductor device including the composition for the optical semiconductor device according to the invention as the sealing agent is also one aspect of the invention.

EXAMPLES

The invention is described in greater detail by way of Examples. In addition, the invention is not limited by the Examples described below.

(A) Thermosetting Resin Containing an SiH Group and an Alkenyl Group, the Thermosetting Resin Being a Reaction Product Between Silsesquioxane Having the SiH Group and Organopolysiloxane Having Two Alkenyl Groups As a thermosetting resin containing an SiH group and an alkenyl group, being component (A) according to the invention, silsesquioxane derivative base polymer 1 and silsesquioxane derivative base polymer 2 as described below that were manufactured by the method disclosed in WO 2011/145638 A were used.

Silsesquioxane Derivative Base Polymer 1

A compound represented by a chemical formula below in which a (in formula (X-I)) is 2.34, 2b (in formula (X-II)) is 0, and c (in formula (X-III)) is 1.66 in the formula (1) was taken as silsesquioxane derivative base polymer 1.

Formula 16

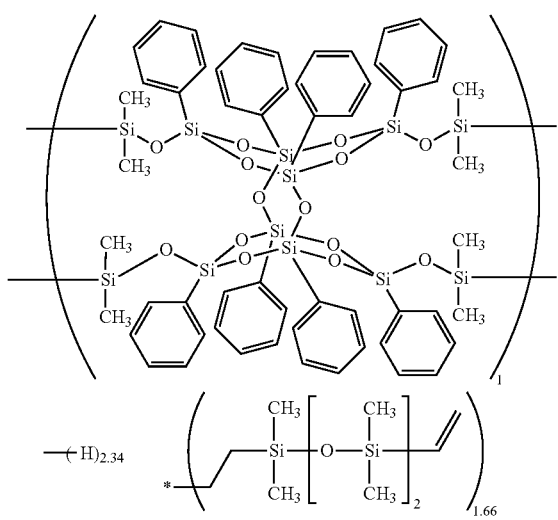

Silsesquioxane Derivative Base Polymer 2

A compound represented by a chemical formula below in which a (in formula (X-I)) is 2.37, 2b (in formula (X-II)) is 0.48, and c (in formula (X-III))) is 1.14 in the formula (1) was taken as silsesquioxane derivative base polymer 2.

Formula 17

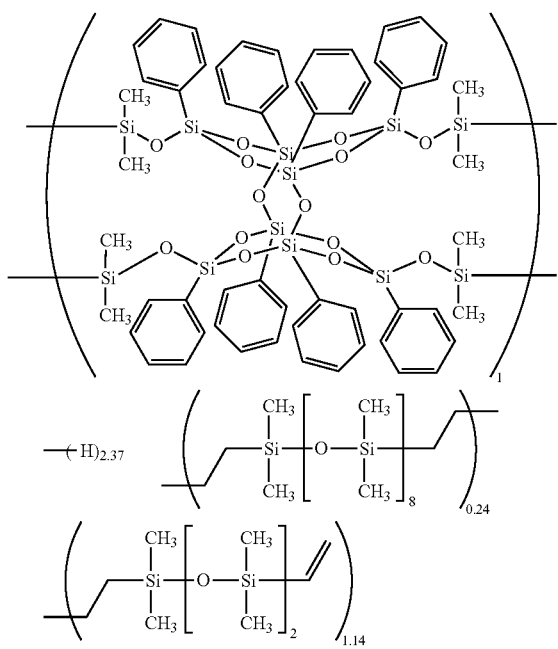

Measurement of Number Average Molecular Weight

The number average molecular weight of a polymer synthesized in the invention was measured as described below. High performance liquid chromatograph system CO-2065 plus made by JASCO Corporation was used, 20 microliters of THF solution of a sample having a concentration of 1% by mass was used as an analytical sample, and measurement was carried out according to a GPC method under conditions of column: Shodex KF804L (made by Showa Denko K.K.) (two columns being connected in series), column temperature: 40° C., a detector: RI, an eluate: THF, and an eluate flow rate: 1.0 mL per minute to calculate a polystyrene equivalent, and thus the molecular weight was determined.

(B) Linear Organopolysiloxane Compound Having an SiH Group Only at One Terminal

As linear organopolysiloxane compound having an SiH group only at one terminal, being component (B) according to the invention, one-terminal SiH silicone having the number average molecular weight of 900 or 500 made by JNC Corporation was used. Moreover, as a comparative compound relative to component (B), both-terminal SiH silicone having the number average molecular weight of 500 was used.

As organopolysiloxane having the SiH group only at one terminal and having the number average molecular weight of 900 or 500, a product manufactured with reference to the method described in JP 2000-273178 A was used. Moreover, as both-terminal SiH silicone having the number average molecular weight of 500, a product manufactured with reference to the method described in JP 2003-252995 A was used.

One-Terminal SiH Silicone Having Number Average Molecular Weight of 900

A compound represented by a chemical formula below in which $R^6$ is butyl, $R^7$ is methyl and m is 11 in the formula (2) was taken as one-terminal SiH silicone having the number average molecular weight of 900.

Formula 18

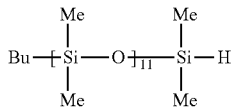

One-Terminal SiH Silicone Having Number Average Molecular Weight of 500

A compound represented by a chemical formula below in which $R^6$ is butyl, $R^7$ is methyl and m is 5 in the formula (2) was taken as one-terminal SiH silicone having the number average molecular weight of 500.

Formula 19

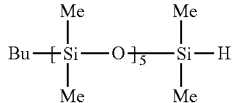

Both-Terminal SiH Silicone Having Number Average Molecular Weight of 500

As the comparative compound relative to component (B) according to the invention, both-terminal SiH silicone having the number average molecular weight of 500 as represented by a chemical formula below was used.

Formula 20

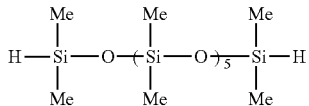

(C) Silane Coupling Agent Having an Epoxy Group

As a silane coupling agent being component (C) according to the invention, glycidylethertrimethoxysilane: registered trade name Sila-Ace S510 (made by JNC Corporation) was used.

(D) Pt Catalyst

As a Pt catalyst being component (D) in the invention, a Karstedt catalyst (trade name Pt-VTS) 3 wt % xylene solution (made by Umicore N.V.) was used.

(E) Organopolysiloxane Having Two or More Alkenyl Groups

As an organopolysiloxane compound having two or more alkenyl groups being component (E) according to the invention, a compound represented by a chemical formula below in which $R^8$ is methyl, $R^9$ is methyl and n is 8 in the formula (3) was taken as both-terminal SiH silicone having the number average molecular weight of 700.

Formula 21

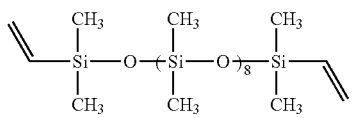

Preparation of a Thermosetting Resin Composition

The compound prepared in Examples described above or a mixture of organopolysiloxane was put in a screw vial. The screw vial was set to Planetary Centrifugal Mixer (Thinky Mixer (registered trademark) ARE-250, made by Thinky Corporation), and mixing and defoaming were performed.

A material obtained by diluting the Karstedt catalyst (trade name Pt-Vtx: 3 wt % xylene solution) made by Umicore N.V. 10 times with a hardening retarder: MVS-H (trade name, 1,3,5,7-tetravinyl-1,3,5,7-tetramethylcyclotetrasiloxane: made by JNC Corporation) was added to be a predetermined amount in a Pt concentration, and mixing and defoaming were performed again using Planetary Centrifugal Mixer to obtain compositions a to e being thermosetting resin compositions, and comparative compositions f to h and j. An amount (g) of blending each thermosetting resin composition is presented in Table 1.

Preparation of Filler-Containing Composition

Silica was dispersed as a filler into the thermosetting resin composition to obtain compositions cs1 and cs2. An amount (g) of blending each thermosetting resin composition is presented in Table 3.

Silsesquioxane derivative base polymer 1, one-terminal SiH silicone having the number average molecular weight of 900, S510 and silica were mixed, according to blending ratios in Table 3, using a three-roll mill to obtain the thermosetting resin into which silica was dispersed in a nano order.

Then, both-terminal vinyl silicone having the number average molecular weight of 700 and the Pt catalyst were again mixed, according to blending ratios in Table 3, and defoamed using Planetary Centrifugal Mixer to obtain compositions as1 to as3 being the thermosetting resin compositions. An amount (g) of blending each thermosetting resin composition is presented in Table 3.

In addition, silica used therein was as described below.

Silica I: fumed silica, hydrophilic type, mean primary particle size 7 nm, trade name: Aerosil #300 made by Nippon Aerosil Co., Ltd.

Silica II: fumed silica, hydrophilic type, mean primary particle size 12 nm, trade name: Reolosil QS102 made by Tokuyama Corporation.

Preparation of a Hardened Material

With regard to the thermosetting resin composition, Naflon SP packing (diameter 4 mm) made by NICHIAS Corporation was interposed as a spacer between two sheets of glass, a thermosetting resin composition was poured thereinto and defoamed under reduced pressure, and then heated at 80° C. for 1 hour, and then at 150° C. for 4 hours in the order, thereby hardening the composition, and the glass was pealed to obtain 4 mm-thick hardened materials a to e each having a smooth surface, and comparative hardened materials f to h and j.

Physical properties of hardened materials a to e and comparative hardened materials f to h and j obtained were evaluated by the methods described below. The results are presented in Table 2.

Viscosity

Viscosity of a hardened material was measured using TV-22 type viscometer (cone-plate type) made by Toki Sangyo Co., Ltd. at 25° C. as a temperature of a constant-temperature bath.

Light Transmittance

Then, 4 mm-thick hardened materials were prepared, and light transmittance thereof at a wavelength of 400 nanometers was measured by UV-Vis Spectrophotometer UV-1650 made by Shimadzu Corporation.

Heat-Resistance Transmittance

A heat resistance test was conducted according to a method described below and evaluated. Then, 4 mm-thick hardened materials were prepared, and light transmittance thereof at a wavelength of 400 nanometers was measured by UV-Vis Spectrophotometer UV-1650 made by Shimadzu Corporation, and thus the measured value was taken as initial transmittance. The hardened materials were put in an oven at 180° C. (constant-temperature dryer: DX302 made by Yamato Scientific Co., Ltd.) and subjected to heat treatment for a fixed period of time (1,000 hours in Table 2).

Luminous transmittance of the hardened material after the heat resistance test was measured by the UV-Vis Spectrophotometer, and from transmittance at a wavelength of 400 nanometers, a retention ratio ((transmittance after heat treatment for a fixed period of time/initial transmittance at each wavelength)×100) at the wavelength was calculated and evaluated. With regard to the retention ratio of transmittance at the wavelength of 400 nanometers after 1,000 hours in the heat resistance test at 180° C., a case where the retention ratio was 85% or more was rated to be "good," a case where the retention ratio was 75% or more was rated to be "marginal," and a case where the retention ratio was 75% or less was rated to be "poor."

UV-Resistance Transmittance

With regard to UV-resistance transmittance, 4 mm-thick hardened materials were irradiated with UV light having an irradiation intensity of 550 to 600 mW/cm through a 365 nm band-pass filter by using Deep UV Lamp made by USHIO, Inc. A case where a retention ratio at 400 nm after irradiation of 2,000 hours was 99% or more was rated to be "good," a case where the retention ratio was 97% or more was rated to be "marginal," and a case where the retention ratio was 97% or less was rated to be "poor."

Refractive Index

A hardened material was cut using a bandsaw to prepare a test specimen in accordance with JIS K7142 (2008). A refractive index of the test specimen was measured using a D line (586 nm) of a sodium vapor lamp by an Abbe refractometer (NAR-2T made by ATAGO Co., Ltd.). As an intermediate liquid, methylene iodide was used.

Hardness

In accordance with specifications of JIS K6253 (2006), D hardness or A hardness was measured by Durometer WR-105D or Durometer WR-104A, made by Nishitokyo Seimitsu Co., Ltd.

Tackiness

Tackiness on a surface of a hardened material was confirmed by touching a sample surface with a finger. A case where a finger slipped on the sample surface without tackiness was rated to be "good," a case where gripping feeling was sensed a little was rated to be "marginal," and a case where stickiness was sensed was rated to be "poor."

Adhesion Strength Test PPA

A test was conducted in accordance with JIS K6850 (1999). A test specimen was prepared by interposing a thermosetting resin composition between materials as base materials prepared by adjusting a dimension of a polyphthalamide resin (Amodel (trade name) A-4122NLWH905 made by Solvay Advanced Polymers, L.L.C.) in accordance with JIS K6850 (1999), and heating and hardening the resultant material at 80° C. for 1 hour and then at 150° C. for 1 hour. As an adhesion test, strength was measured using a load cell of 5 kN by a tensile compression tester (Autograph AGS-500B made by Shimadzu Corporation).

Cohesive Failure

With regard to a ruptured phase of the specimen upon measuring longitudinal shear strength in the adhesion strength test PPA, a case of cohesion failure was taken as "cohesive," and a case of interfacial peeling was taken as "interfacial." In addition, the cohesive failure refers to rupture of the hardened material itself without causing interfacial peeling between the base material and the hardened material of the composition, and means that the hardened material has adhesion with the base material. A case where the cohesive failure and the interfacial peeling were intermingled was taken as "cohesive/interfacial."

Adhesion Strength Test PA9T

A test was conducted in accordance with JIS K6850 (1999). A test specimen was prepared by interposing a thermosetting resin composition between materials as base materials prepared by adjusting a dimension of a polyphthalamide resin (Genestar PA9T (trade name) made by Kuraray Co., Ltd.) in accordance with JIS K6850 (1999), and heating and hardening the resultant material at 80° C. for 1 hour and then at 150° C. for 1 hour. As an adhesion test, strength was measured using a load cell of 5 kN by a tensile compression tester (Autograph AGS-500B made by Shimadzu Corporation).

Cohesive Failure

With regard to a ruptured phase of the specimen upon measuring longitudinal shear strength in the adhesion strength test PA9T, a case of cohesion failure was taken as "cohesive," and a case of interfacial peeling was taken as "interfacial." In addition, the cohesive failure refers to rupture of the hardened material itself without causing interfacial peeling between the base material and the hardened material of the composition, and means that the hardened material has adhesion with the base material. A case where the cohesive failure and the interfacial peeling were intermingled was taken as "cohesive/interfacial."

Water Vapor Transmission Rate

A test was conducted in accordance with JIS Z0208. As a test specimen, a 0.9 mm-thick hardened material was prepared, and placed in a cup having a diameter of 70 mm all over which calcium chloride as water absorbent was spread, and then fixed. A weight increment was measured every 24 hours under conditions of 40° C. and a humidity of 90 RH. In addition, an effective area was 28.26 cm$^2$. A water vapor transmission rate was determined by a formula below.

Water vapor transmission rate (g/m$^2$/24 h)=240×{(specimen total weight (g) after testing the transmission rate)−(specimen total weight (g) before testing the transmission rate)}×/28.26.

Moisture-Absorption Reflow Test

Into 16 pieces of PPA resin packages for power LED subjected to silver plating on a bottom portion (Model Number 5050 DIG made by Enomoto Co., Ltd.), thermosetting resin compositions were poured thereinto by a dispenser (Model Number MPP-1 made by Musashi Engineering, Inc.), and then the compositions were subjected to heating and hardening at 80° C. for 1 hour and then at 150° C. for 4 hours. The PPA resin packages were subjected to moisture absorption under conditions of a temperature of 30° C., a relative humidity of 60%, and 192 hours in an environmental test machine (Model Number SH-241 made by Espec Corporation), and passed through a reflow furnace twice using a simulation reflow furnace (Model Number SRS-1C made by Malcom Co., Ltd.) under temperature conditions (260° C.) in accordance with JEDEC standards. The number of pieces peeled and the number of pieces cracked in 16 pieces were shown.

Reflow Heat Cyclic Test

Into 16 pieces of PPA resin packages for power LED subjected to silver plating on a bottom portion (Model Number 5050 D/G made by Enomoto Co., Ltd.), thermosetting resin compositions were poured thereinto by a dispenser (Model Number MPP-1 made by Musashi Engineering, Inc.), and then the compositions were subjected to heating and hardening at 80° C. for 1 hour and then at 150° C. for 4 hours. The PPA resin packages were passed through reflow once using a simulation reflow furnace (Model Number SRS-1C made by Malcom Co., Ltd.) under temperature conditions (260° C.) in accordance with JEDEC standards. Then, the packages were put into a test area of cold impact tester TSE-11 made by ESPEC Corporation, and tested by repeating 500 cycles by taking as one cycle exposure at −40° C. for 30 minutes, and at 150° C. for 30 minutes. In addition, the test was conducted by adjusting transfer time to be 2 minutes between both exposure temperatures. Generation of peeling and cracks was observed by a microscope. A fraction defective in 15 pieces is presented.

TABLE 1

|  | Composition |  |  |  |  | Comparative composition |  |  |  |
|---|---|---|---|---|---|---|---|---|---|
|  | a | b | c | d | e | f | g | h | j |
| (A) Silsesquioxane derivative base polymer 1 (% by mass) | 87.6 | 81.3 | 84.3 | 87.6 | 81.3 | 90.0 | 84.0 | 78.0 | — |
| Silsesquioxane derivative base polymer 2 (% by mass) | — | — | — | — | — | — | — | — | 84.0 |

TABLE 1-continued

|  | Composition | | | | | Comparative composition | | | |
|---|---|---|---|---|---|---|---|---|---|
|  | a | b | c | d | e | f | g | h | j |
| (B) One-terminal SiH silicone having the number average molecular weight of 900 (% by mass) | 7.6 | 14.2 | 14.7 | — | — | — | — | — | — |
| One-terminal SiH silicone having the number average molecular weight of 500 (% by mass) | — | — | — | 7.6 | 14.2 | — | — | — | — |
| Both-terminal vinyl silicone having the number average molecular weight of 700 (% by mass) | 3.8 | 3.5 | — | 3.8 | 3.5 | 9.0 | 15.0 | 21.0 | 15.0 |
| Both-terminal SiH silicone having the number average molecular weight of 500 (% by mass) | — | — | — | — | — | — | — | — | — |
| (C) S510 (% by mass) | 1 | 1 | 1 | 1 | 1 | 1 | 1 | 1 | 1 |
| (D) Pt catalyst | 0.5 ppm | 0.5 ppm | 0.1 ppm | 0.5 ppm | 0.5 ppm | 1 ppm | 1 ppm | 2 ppm | 1 ppm |

TABLE 2

|  | Hardened Material | | | | | Comparative hardened Material | | | |
|---|---|---|---|---|---|---|---|---|---|
|  | a | b | c | d | e | f | g | h | j |
| Viscosity | 2500 | 1900 | 2200 | 2500 | 1800 | 3000 | 2500 | 1800 | 3000 |
| Light transmission | 99 | 98 | 98 | 98 | 99 | 99 | 98 | 96 | 98 |
| Heat-resistance transmission | G | G | G | G | G | G | M | P | G |
| UV-resistance transmission | G | G | G | G | G | G | M | P | G |
| Refractive Index | 1.51 | 1.50 | 1.51 | 1.51 | 1.50 | 1.51 | 1.49 | 1.48 | 1.50 |
| Hardness   D hardness | 25 | 13 | 25 | 17 | — | 60 | 45 | 17 | 35 |
|            A hardness | 75 | 60 | 75 | 65 | 30 | — | — | 66 | 81 |
| Tackiness | G | G | G | G | M | G | G | P | G |
| Adhesion strength Test PPA (MPa) | 1.9 | 1.5 | 2.2 | 1.4 | 1.3 | 3.5 | 2 | 1 | 1.5 |
| mode | C | C | C | C | C | C/I | C/I | I | C/I |
| Adhesion strength Test PA9T (MPa) | 2.5 | 1.5 | 2.4 | 1.5 | 1.0 | 2 | 1.5 | 0.5 | 1.2 |
| mode | C | C | C | C | C | C/I | I | I | C/I |
| Water vapor transmission rate (%) | 22 | 24 | 21 | 25 | 28 | 17 | 25 | 33 | 25 |
| Moisture-absorption reflow  Number of pieces peeled | 2 | 2 | 0 | 2 | 0 | 2 | 15 | 15 | 13 |
|                                  Number of pieces cracked | 0 | 0 | 0 | 0 | 0 | 3 | 7 | 13 | 5 |
| Reflow heat cyclic test Fraction defective (%) | 7 | 0 | 0 | 10 | 0 | 100 | 100 | 100 | 100 |

Abbreviations:
G; good,
M; marginal,
P; poor,
C; cohesive,
I: interfacial,
C/I;

TABLE 3

|  | Composition | | |
|---|---|---|---|
|  | as1 | as2 | as3 |
| (A) Silsesquioxane derivative base polymer 1 (% by mass) | 87.6 | 87.6 | 87.6 |
| (B) One-terminal SiH silicone having the number average molecular weight of 900 (% by mass) | 7.6 | 7.6 | 7.6 |
| Both-terminal vinyl silicone having the number average molecular weight of 700 (% by mass) | 3.8 | 3.8 | 3.8 |
| (C) S510 (% by mass) | 1 | 1 | 1 |
| Silica I | 1 | — | — |
| Silica II | — | 1 | 3 |
| (D) Pt catalyst | 0.5 ppm | 0.5 ppm | 0.5 ppm |

TABLE 4

|  |  | Composition | | |
|---|---|---|---|---|
|  |  | as1 | as2 | as3 |
| Hardness | Refractive index | 1.51 | 1.51 | 1.51 |
|  | D hardness | 25 | 28 | 32 |
|  | A hardness | 75 | 78 | 81 |
|  | Tackiness | good | good | good |
|  | Adhesion strength test PPA (MPa) | 2 | 2.1 | 2.1 |
|  | mode | cohesive | cohesive | cohesive |
|  | Adhesion strength test PA9T (MPa) | 2.6 | 2.7 | 2.6 |
|  | mode | cohesive | cohesive | cohesive |
|  | Water vapor transmission rate (%) | 21 | 21 | 21 |
| Moisture-absorption reflow | Number of pieces peeled | 0 | 0 | 0 |
|  | Number of pieces cracked | 0 | 0 | 0 |
|  | Reflow heat cycle test Fraction defective (%) | 0 | 0 | 0 |

As is presented in Table 2, hardened materials a to e prepared using compositions a to e according to the invention were found to have the hardness in the range of D45 or less to A30 and the refractive index in the range of 1.5 or more, and further excellent heat resistance and UV resistance, and good adhesion with the polyphthalamide resin (PPA, PAST), and further excellent moisture-absorption reflow resistance and heat cycle resistance.

In contrast, with regard to comparative hardened material f prepared using comparative compound f without using the organopolysiloxane compound having the SiH group only at one terminal, while the adhesion was high, the hardness was too high to have no heat cycle resistance. Moreover, in comparative hardened material g prepared using comparative compound g, the hardness decreased only to D45. Furthermore, the heat resistance thereof deteriorated. In comparative hardened material h prepared using comparative compound h, the hardness decreased to 66 in terms of A hardness, but both the heating resistance and the UV resistance thereof deteriorated, and the adhesion also deteriorated.

Comparative hardened material j prepared using comparative composition j had 30 in terms of D hardness and was excellent in the heat resistance, the UV resistance and the adhesion, but was poor in the moisture-absorption reflow resistance and the heat cycle resistance.

As is presented in Table 4, the compositions into which silica was dispersed according to the invention were also found in a similar manner to have the hardness in the range of D45 or less to A30, and the refractive index in the range of 1.5 or more, and good adhesion with the polyphthalamide resin (PPA, PA9T), and further excellent moisture-absorption reflow resistance and heat cycle resistance. Further, in the composition, silica was dispersed thereinto in the nano order, which contributes to capability of prevention of sedimentation of the phosphor, efficient extraction of light, and also reduction of a fluctuation of color.

Although the invention has been described in detail using a specific embodiment, it is clear that numerous changes and modifications can be resorted to by those skilled in the art without departing from the spirit and scope according to the invention. In addition, the present application is based on Japanese patent application (JP 2012-232847 A) filed on Oct. 22, 2012, and entirely is incorporated by reference.

INDUSTRIAL APPLICABILITY

A thermosetting resin composition according to the invention has a high heat resistance and high UV resistance, and a high adhesion with a base material and excellent toughness, and therefore gives a hardened material having excellent moisture-absorption reflow resistance and heat cycle resistance, and thus the composition is significantly useful particularly as a sealing material of an optical semiconductor device such as a high power LED.

The invention claimed is:

1. A thermosetting resin composition containing (A) to (D) below:
   (A) a thermosetting resin containing an SiH group and an alkenyl group, wherein the thermosetting resin is a reaction product between silsesquioxane having the SiH group and organopolysiloxane having two alkenyl groups;
   (B) a linear organopolysiloxane compound having an SiH group only at one terminal;
   (C) a silane coupling agent having an epoxy group; and
   (D) a Pt catalyst,
   wherein the silsesquioxane is double decker silsesquioxane.

2. The thermosetting resin composition according to claim 1, containing organopolysiloxane compound (E) having two or more alkenyl groups.

3. The thermosetting resin composition according to claim 2, wherein the organopolysiloxane compound (E) having two or more alkenyl groups is a compound represented by formula (3) below:

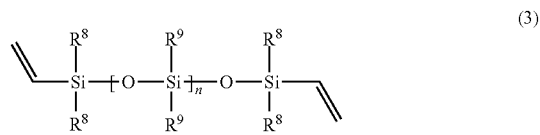

(3)

wherein, in formula (3), $R^8$ and $R^9$ are each independently a group selected from alkyl having 1 to 4 carbons, cyclopentyl, cyclohexyl and phenyl, and n is the number of repetitions of $—OSi(R^9)_2—$, and is a mean value satisfying 1 to 50.

4. The thermosetting resin composition according to claim 2, containing the organopolysiloxane compound (E) in a ratio of 1 to 10% by mass.

5. The thermosetting resin composition according to claim 1, wherein the thermosetting resin (A) is a compound represented by formula (1) below:

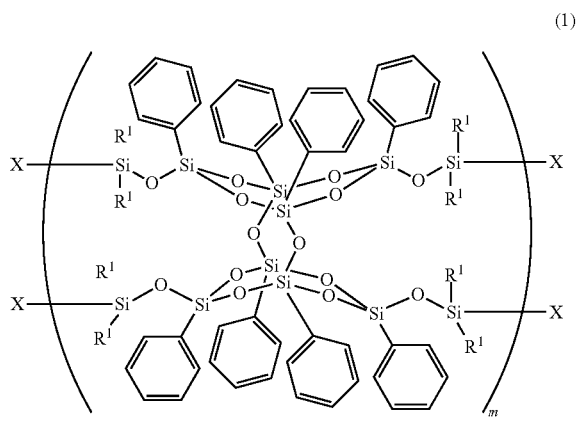

(1)

wherein, in formula (1), X is each independently a group represented by formula (X-I), formula (X-II) or formula (X-III), and when the number of groups represented by formula (X-I) per molecule of the compound represented by formula (1) (average in one molecule of the compound when the compound is a mixture of compounds in which a ratio of a group represented by formula (X-I), a ratio of a group represented by formula (II) and a ratio of a group represented by formula (X-III) are different) is taken as a, the number of groups represented by formula (X-II) is taken as b, and the number of groups represented by formula (X-III) is taken as c, expressions: a+2b+c=4, 0<a≤3, 0≤b≤1, and 0≤c≤3 hold; and $R^1$ is each independently a group selected from alkyl having 1 to 4 carbons, cyclopentyl and cyclohexyl, and m is 1 to 100:

—H     (X-I)

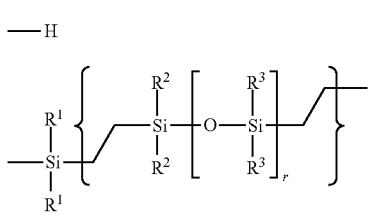     (X-II)

wherein, in formula (X-II), $R^2$ and $R^3$ are each independently a group selected from alkyl having 1 to 4 carbons, cyclopentyl, cyclohexyl and phenyl, $R^1$ is the same as $R^1$ in formula (1), r is the number of repetitions of —OSi($R^3$)$_2$—, and r is a mean value satisfying 2 to 20:

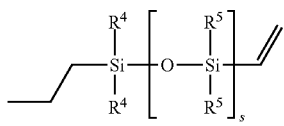     (X-III)

wherein, in formula (X-III), $R^4$ and $R^5$ are each independently a group selected from alkyl having 1 to 4 carbons, cyclopentyl, cyclohexyl and phenyl, s is the number of repetitions of —OSi($R^5$)$_2$—, and s is a mean value satisfying 2 to 20.

6. The thermosetting resin composition according to claim 1, wherein the linear organopolysiloxane compound (B) having the SiH group only at one terminal is a compound represented by formula (2) below:

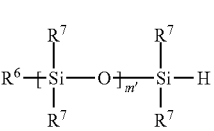     (2)

wherein, $R^6$ and $R^7$ are each independently groups selected from alkyl having 1 to 4 carbons, cyclopentyl, and cyclohexyl, m' is the number of repetitions of —OSi($R^7$)$_2$—, and is a mean value satisfying 1 to 20.

7. The thermosetting resin composition according to claim 1, containing the thermosetting resin (A) in a ratio of 70 to 95% by mass, the organopolysiloxane compound (B) in a ratio of 2 to 20% by mass, and the silane coupling agent (C) in a ratio of 0.1 to 5.0% by mass, based on the total amount of the thermosetting resin composition.

8. The thermosetting resin composition according to claim 1, further containing at least one of silica and a phosphor.

9. A hardened material, obtained by hardening the thermosetting resin composition according to claim 1.

10. A composition for an optical semiconductor, containing the thermosetting resin composition according to claim 1.

11. An optical semiconductor device, including the composition for the optical semiconductor according to claim 10 as a sealing material.

* * * * *